United States Patent [19]

Atkinson et al.

[11] 4,037,196
[45] July 19, 1977

[54] GEARSHIFT POSITION INDICATOR

[75] Inventors: Steven B. Atkinson; James E. Reed, both of Cumberland, Md.

[73] Assignee: Steven B. Atkinson, Cumberland, Md.

[21] Appl. No.: 759,582

[22] Filed: Jan. 14, 1977

[51] Int. Cl.$^2$ .............................................. B60Q 1/26
[52] U.S. Cl. ................................... 340/70; 200/61.88; 340/282; 340/79; 307/115
[58] Field of Search ................. 340/70, 79, 52 R, 282; 200/61.88

[56] References Cited

U.S. PATENT DOCUMENTS

| | | | |
|---|---|---|---|
| 2,005,483 | 6/1935 | Sucky et al. | 200/61.88 |
| 2,610,518 | 9/1952 | Goedeke et al. | 340/52 X |
| 3,631,946 | 1/1972 | Grosseau | 200/61.88 X |

*Primary Examiner*—Donald J. Yusko
*Attorney, Agent, or Firm*—LeBlanc & Shur

[57] ABSTRACT

An apparatus for indicating the position of a gearshift mechanism of a transmission which includes a plurality of forward-speed shift bars contained in and movable within a transmission housing; a number of microswitches are mounted in the housing for selective engagement by the shift bars. The microswitches feed a coding device which generates unique binary codes depending upon the microswitch or switches engaged by the shift bars when the latter are moved into position by a gearshift selector lever, for engaging one of a number of gears of the multiple gear transmission. The binary coded signals are decoded in a decoder/driver which in turn is connected to a digital display device for numerically displaying the selected gear.

10 Claims, 7 Drawing Figures

4,037,196

GEARSHIFT POSITION INDICATOR

BACKGROUND OF THE INVENTION

This invention relates to a device for indicating the position of a gearshift lever, particularly for use with commericial or industrial vehicle transmissions having five or more forward speeds.

The invention is particularly applicable to tractor-trailers or other vehicles having anywhere from five to fifteen speed transmissions. Very often a driver of such a vehicle has no way of rapidly and accurately determining which gear is engaged. This is particularly troublesome in units having two or more gear ranges (such as high/low or overdrive) since one gearshift position may represent two or three different gears. Thus, for example in a unit having low, direct and high ranges, the first gearshift position may represent gears 1, 6 and 11. Also, when the vehicle is being operated at night, the gearshift position can be difficult to determine in the dark.

If, for example, the driver attempts to start off and thinks, by looking at the main gearshift lever, that he is in first gear, when in fact he is in gear six or gear eleven, the drive train could be damaged due to excessive torque being applied to both the clutch assembly and the transmission. On the other hand, if the driver is trying to downshift, such as when traversing a long downhill slope, he may think he is in a lower gear than he actually is, thus producing excessive wear on the clutch, transmission and brakes.

Devices for ascertaining the state of a gearbox are know. U.S. Pat. No. 3,943,792, issued Mar. 16, 1976 to Sibeud, for example, discloses an apparatus employing transverse bars which rest on the sliding gear selector rods of a standard gearbox. The transverse bars engage notches machined in the gear selector rods to generate signals representative of the position of the selector rods. A device of this type requires that major modification be made to the standard gearbox, including (1) accurately machining additional notches in the gear selector rods in a particular coded format; and (2) providing the gearbox with additional mechanical members, such as movable transverse bars.

The purpose of the gearshift position indicator of this invention is to provide the operator of the vehicle with a visual indication of which gear is engaged in the transmission, thereby enabling the driver to change gears in the desired manner to avoid damage to the engine, drive train, brakes, etc.

Another object of this invention is to provide a simplified mechanical construction which requires only minor modifications to a standard gearbox and is therefore economically practical.

Another object of this invention is to permit gearboxes presently in use to be easily retrofitted with the position indicator by an ordinary mechanic, which makes the addition of this invention to vehicles currently on the road further economically practical.

Briefly, the invention comprises a number of microswitches mounted on the transmission housing for engagement with the shift bars of the transmission. The microswitches are connected to a coder which generates binary coded decimal (BCD) signals representing the shift bar positions corresponding to the engaged gear in the transmission. The output of the coder drives a seven segment LED digital display unit through a decoder/driver circuit. The LED display provides a visual indication of the number of the gear engaged.

BRIEF DESCRIPTION OF THE DRAWINGS

A preferred embodiment of the invention will be described in detail hereunder with reference to the accompanying drawing figures wherein.

DESCRIPTION OF THE PREFERRED EMBODIMENT

Figure 1:
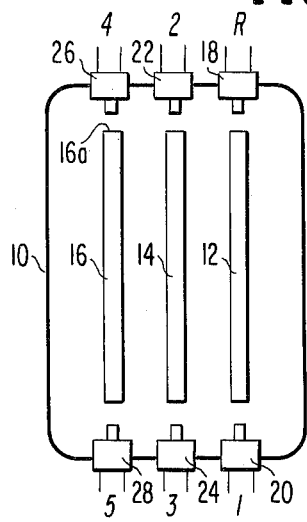
FIG. 1 shows a representation of the gearbox housing modified to incorporate the microswitches used in this invention.

FIG. 1 is a representative drawing of a gearbox housing 10 of a five-speed transmission. The housing 10 contains three shift bars 12, 14 and 16 which control the selection of the gears, through shift forks (not shown), by manual movement of the gearshift lever by the vehicle operator in a conventional manner. Shift bar 12 controls the selection of reverse (R), and first gear (e.g., the first forward speed); shift bar 14 controls the selection of the second and third gears (e.g., the second and third forward speeds); and shift bar 16 controls the selection of the fourth the fifth gears (e.g., the fourth and fifth forward speeds). The mechanics of such gearboxes are well known (see, for example, *The Way Things Work*, Simon & Schuster, 1967 ).

For this invention, the conventional gearbox housing is modified to provide a plurality of threaded openings in the housing 10. These openings may be located in the housing adjacent the opposite ends of each shift bar. Mounted in each threaded opening is a microswitch. Microswitches 18 and 20 are located adjacent the opposite ends of shift bar 12; switches 22 and 24 are located adjacent the opposite ends of shift bar 14; and switches 26 and 28 are located adjacent the opposite ends of shift bar 16.

An example of one type of microswitch applicable to this invention is a single pole, double throw, momentary contact switch manufactured by Microswitch Company, catalog listing 1 HT1.

It will be appreciated that specific locations of the microswitches need not be as described above. It is only necessary that they be located in the gearbox housing in such a way as to be operated by their associated shift bars when the latter are moved into their respective gear engaging positions.

Microswitch 18 detects movement of shift bar 12 into position to engage reverse gear. Switch 20 detects movement of shift bar 12 into position to engage first gear; switches 22 and 24 detect movement of shift bar 14 into position to engage second and third gears, respectively; and switches 26 and 28 detect movement of shift bar 16 into positions to engage fourth and fifth gears, respectively.

Figure 2:
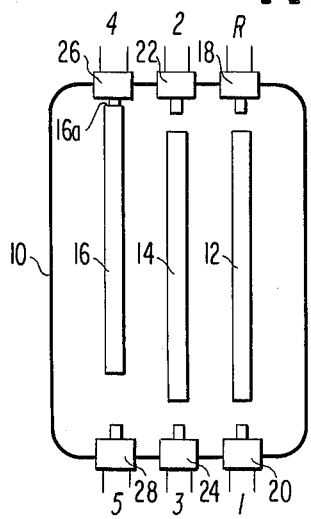
FIG. 2 shows a representation of the modified gearbox housing with fourth gear engaged.

FIG. 2 shows the housing 10 and shift bars 12, 14 and 16, wherein shift bar 16 has been moved by the gearshift selector lever (not shown) into the fourth speed position (i.e., fourth gear is engaged). In this position, the end portion 16a of shift bar 16 engages the microswitch 26 to produce a signal indicating that fourth gear is engaged.

Figure 3:
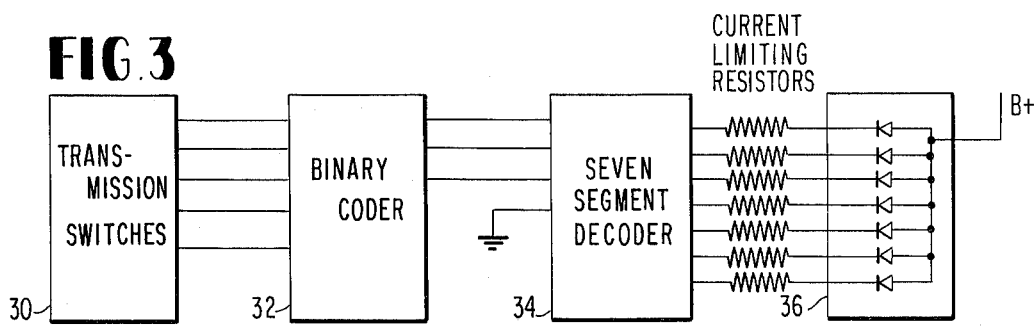
FIG. 3 is a block diagram of the electrical circuit of this invention.

FIG. 3 is a block diagram of the circuit of this invention. The microswitches 20, 22, 24, 26 and 28 (represented by block 30) are signal depending upon which microswitch is closed. The output of the binary coder 32 is connected to a decoder/driver 34, the output of which is connected to a digital display device 36, such as an LED indicator. In a preferred embodiment of this invention, the binary coder, decoder/driver and digital-display unit are composed of available integrated circuit modules. The binary coder may consist of a 7402 quad two-input NOR gate and a 7404 hex inverter (both manufactured by Radio Shack under the Archer brand. The decoder/driver 34 may consist of a 7448 seven segment decoder display driver integrated circuit, also manufactured by Radio Shack under the Archer trade name. The digital-display device may be an HP5082-7740 common anode LED numeric display unit, manufactured by Hewlett-Packard.

Figure 4:
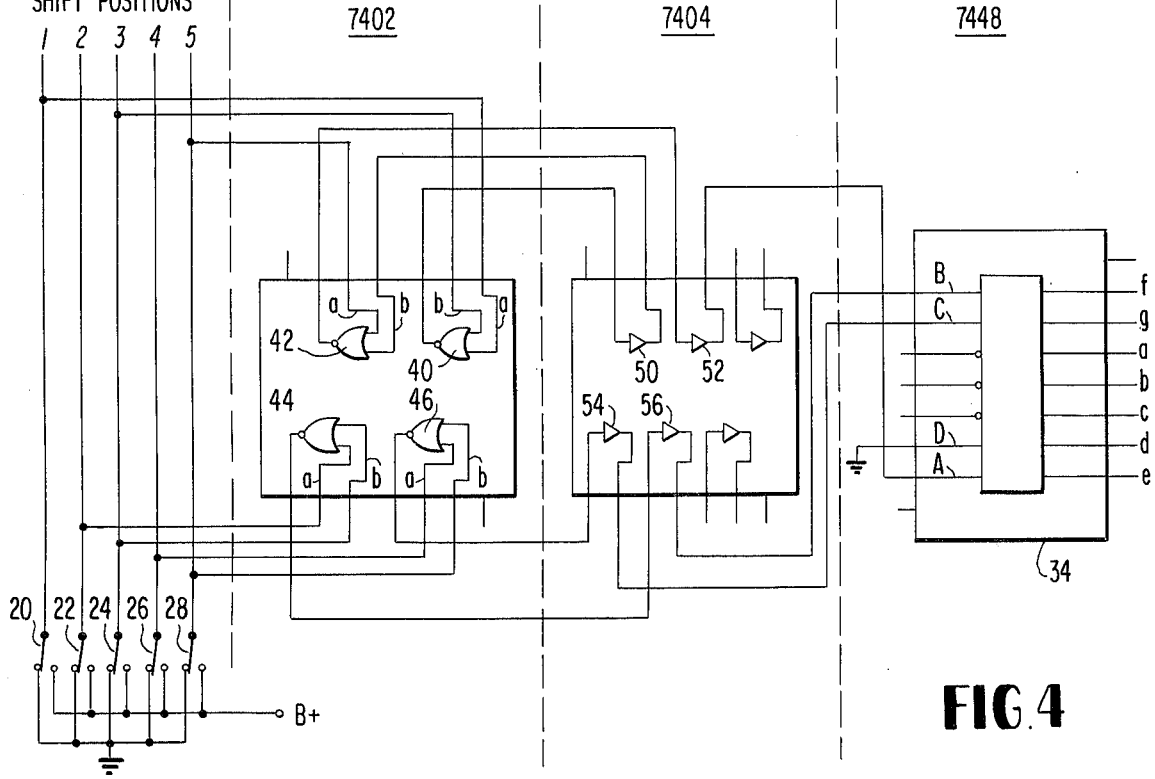
FIG. 4 is a detailed circuit diagram of this invention for use with a five-speed transmission.

FIG. 4 is a circuit diagram of an embodiment of this invention for use with a five-speed transmission. Switches 20, 22, 24, 26 and 28 as shown are connected to the inputs of the NOR gates of the 7402 module, the outputs of which are connected, through the 7404 hex inverter to the 7448 decoder/driver.

As shown in FIG. 4, the microswitches are connected so that the movable contact member of each switch is normally engaged with the grounded contact. When engaged by a shift bar, the microswitch contact member is moved into contact with the positive terminal of a voltage source, designated B+, which may be the vehicle battery. In this embodiment, switch 20 is connected to input 40a of NOR gate 40. Switch 22 is connected to input 44a of NOR gate 44. Switch 24 is connected to input 40b of NOR gate 40 and to input 44b of NOR gate 44. Switch 26 is connected to input 46a of NOR gate 46. Switch 28 is connected to input 42a of NOR gate 42 and to input 46b of NOR gate 46. The output of NOR gate 40 is connected through inverter 50 to input 42b of NOR gate 42. The output of NOR gate 42 is connected through inverter 52 to the A input of the decoder 34. The output of NOR gate 44 is connected through inverter 56 to the B input of decoder 34. The output of NOR gate 46 is connected through inverter 54 to the C input of decoder 34. The D input of decoder 34 is grounded.

With the circuit described above, each shift position is represented by a unique three digit binary code. Table I below shows the relationship among the gearshift selector position, the microswitch operated when the shift selector moves the corresponding shift bar into position to effect a gear change, and the outputs of the 7404 inverter circuit.

TABLE I

| Shift Position | Microswitch Connected to B+ | Inverter Output (54) | Inverter Output (56) | Inverter Output (52) |
|---|---|---|---|---|
| N | — | 0 | 0 | 0 |
| 1 | 20 | 0 | 0 | 1 |
| 2 | 22 | 0 | 1 | 0 |
| 3 | 24 | 0 | 1 | 1 |
| 4 | 26 | 1 | 0 | 0 |
| 5 | 28 | 1 | 0 | 1 |

As can be seen above, for a five forward speed transmission, it is sufficient to employ only a three digit binary code; up to seven shift positions can be uniquely determined by the three digit code in accord with known binary coding techniques. It will be understood that a binary 1 represents a positive voltage (e.g., +5 volts), and a binary 0 represents a zero voltage or ground potential.

Standard seven segment LED numeric displays are capable of displaying ten digits, 0, 1, 2, ... 9; numerals 8 and 9, in BCD format are represented by four binary digits 1000 and 1001, respectively. Digits 0 through 7 all have a binary zero in their highest order position ($2^3$). Thus, for a five speed transmission, where neutral is represented by (0, 0, 0), it is sufficient to tie input terminal D of the 7448 decoder (representing binary digit $2^3$) to ground, as shown in FIG. 4.

Figure 5:
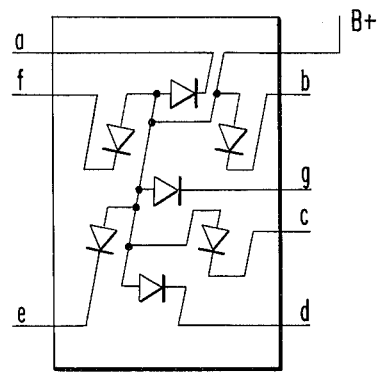
FIG. 5 shows the numeric display device of this invention.

The 7448 decoder has seven outputs, a–g, connected to the correspondingly labeled inputs of the LED numeric display shown in FIG. 5. The HP5082-7740 is a common anode device, in which a current flows through a given diode when the cathode potential drops to zero from B+. The relationship between the microswitches and the decoder outputs is shown in Table II below.

TABLE II

| Microswitch Connected to B+ | Decoder Outputs | | | | | | |
|---|---|---|---|---|---|---|---|
| | a | b | c | d | e | f | g |
| 20 | 1 | 0 | 0 | 1 | 1 | 1 | 1 |
| 22 | 0 | 0 | 1 | 0 | 0 | 1 | 0 |
| 24 | 0 | 0 | 0 | 0 | 0 | 1 | 0 |
| 26 | 1 | 0 | 0 | 1 | 1 | 0 | 0 |
| 28 | 0 | 1 | 0 | 0 | 1 | 0 | 0 |

FIG. 5 is a circuit diagram of an embodiment of this invention for use with a ten-speed transmission. Specifically, the circuit shown here replaces the binary coder circuit 32 shown in FIG. 4. In transmissions having two or more shift ranges, a second gearshift selector is provided for shifting from one gear range to another, Thus, a ten speed transmission will have a high and low range and a fifteen-speed tranmission will have low, normal and high or overdrive ranges. One or more microswitches, as appropriate, may be associated with the gear range selector in the same manner as the microswitches associated with the shift bars.

Figure 6:
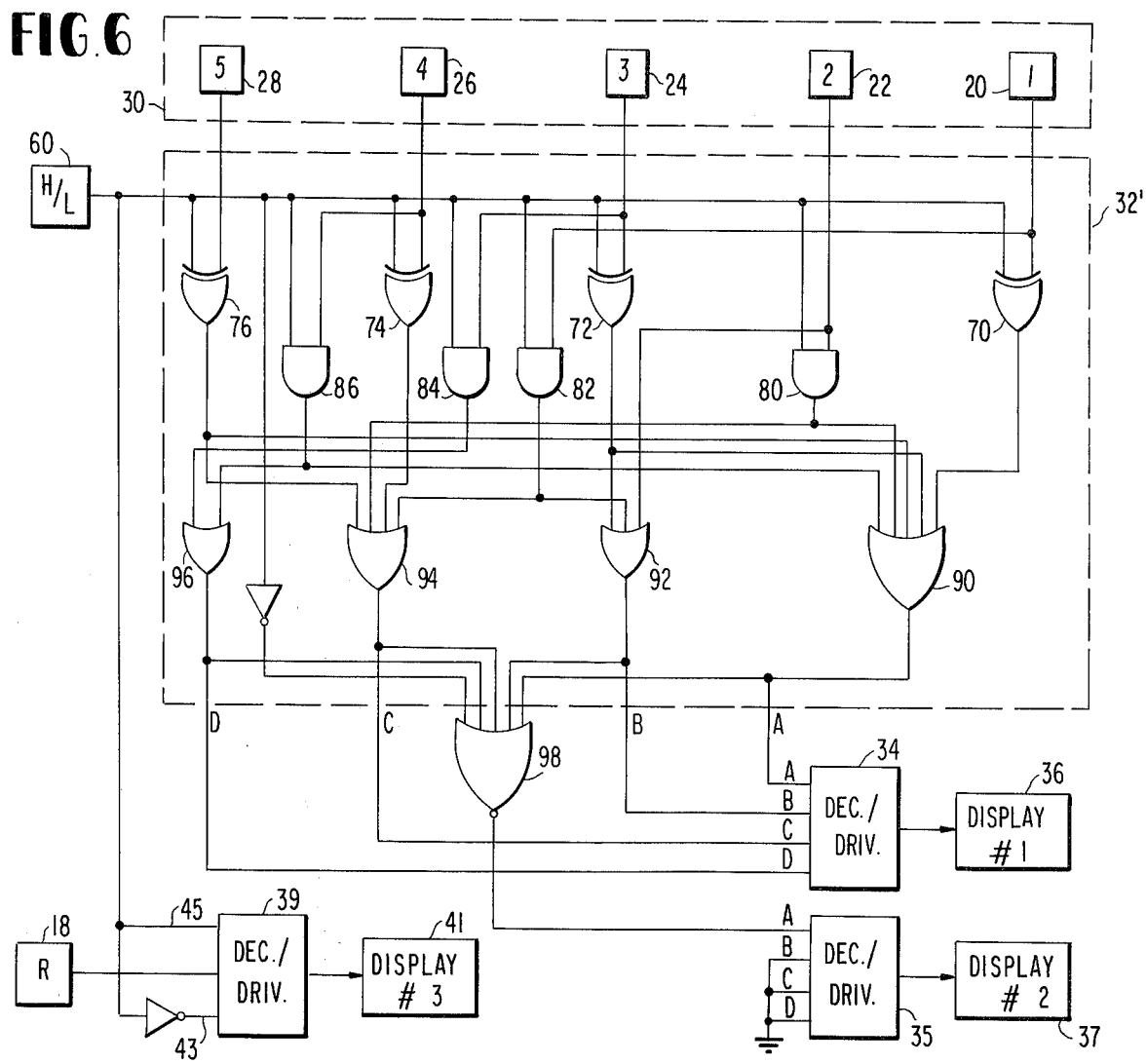
FIG. 6 is a circuit diagram of a second embodiment for use with a ten-speed gearbox.

In the ten speed tranmission display circuit shown in FIG. 6, gear range microswitch 60 is connected to ground in the low range and to B+ in the high range. Exclusive OR gates 70, 72, 74 and 76 each have one input connected in common to switch 60. The second inputs of exclusive OR gates 70, 72, 74 and 76 are respectively connected to switches 20, 24, 26 and 28. AND gates 80, 82, 84 and 86 each have one input connected in common to switch 60 and second inputs connected respectively to switches 22, 20, 24 and 26. An OR gate 90, the output of which is connected to the A input of decoder/ driver 34 has five inputs respectively connected to the outputs of exclusive OR gates 70, 72, and 76 and AND gates 80 and 86. An OR gate 92 has three inputs respectively connected to switch 22 and the outputs of AND gate 82 and exclusive OR gate 72; the output of OR gate 92 is connected to the B input of decoder/driver 34. An OR gate 94, having its output connected to the C input of decoder/driver 34, has four inputs respectively connected to the outputs of AND gates 80 and 82 and exclusive OR gates 74 and 76. An OR gate 96, having its output connected to the D input of decoder/driver 34 has two inputs respectively connected to the outputs of AND gates 84 and 86.

The circuit thus far described will decode shift position 0 through 5 in the low range and 6 through 9 plus the units digit of gear 10 in the high range. In order to display the tens digit of tenth gear, a second decoder/driver 35 and an associated display 37 are provided. Display unit 37 displays either a 1 or a 0; thus, decoder/driver 35 needs only to decode binary code 0 (0000) or binary code 1 (0001). It will be seen, therefore, that decoder 35 needs only to detect a change in state of the A input. Inputs B, C and D are tied to ground and input A is connected to the output of a NOR gate 98. NOR gate 98 has five inputs, four of which are respectively connected to the outputs of OR gates 90, 92, 94 and 96, and the fifth input connected through an inverter to switch 60. A binary 1 appears at the output of NOR gate 98 only when all of its inputs are low (binary 0), which occurs only when fifth gear is engaged in the high gear range.

Table III below shows the correspondence between the output states of OR gates 90, 92, 94 and 96 (corresponding respectively to decoder/driver inputs A, B, C and D), and the shift position.

TABLE III

| | Shift Position | Microswitch(es) Connected to B+ | D(96) | C(94) | B(92) | A(90) | A(98) |
|---|---|---|---|---|---|---|---|
| | N | — | 0 | 0 | 0 | 0 | 0 |
| | 1 | 20 | 0 | 0 | 0 | 1 | 0 |
| Low | 2 | 22 | 0 | 0 | 1 | 0 | 0 |
| | 3 | 24 | 0 | 0 | 1 | 1 | 0 |
| Range | 4 | 26 | 0 | 1 | 0 | 0 | 0 |
| | 5 | 28 | 0 | 1 | 0 | 1 | 0 |
| | 6 | 20, 60 | 0 | 1 | 1 | 0 | 0 |
| High | 7 | 22, 60 | 0 | 1 | 1 | 1 | 0 |
| | 8 | 24, 60 | 1 | 0 | 0 | 0 | 0 |
| Range | 9 | 26, 60 | 1 | 0 | 0 | 1 | 0 |
| | 10 | 28, 60 | 0 | 0 | 0 | 0 | 1 |

If it is also desired to display an L for the low range and an H for the high range, a third decoder/driver 39 and display unit 41 may be provided as shown in FIG. 6. When the range selector is in the low range position, a binary 1 will appear on input line 43 to decoder/driver 39, whereby the cathodes of diodes of display unit 41 will be brought low, causing current to flow through these diodes. Conversely, when the range selector is in the high range position, a binary 1 input will appear on line 45 to decoder/driver 39, causing the cathodes of diodes of display unit 41 to become more negative then their common anodes, permitting current to flow therethrough. Display unit 41 will therefore display an "L" when the range selector is in the low range position and an "H" when the range selector is in the high range position.

Figure 7:
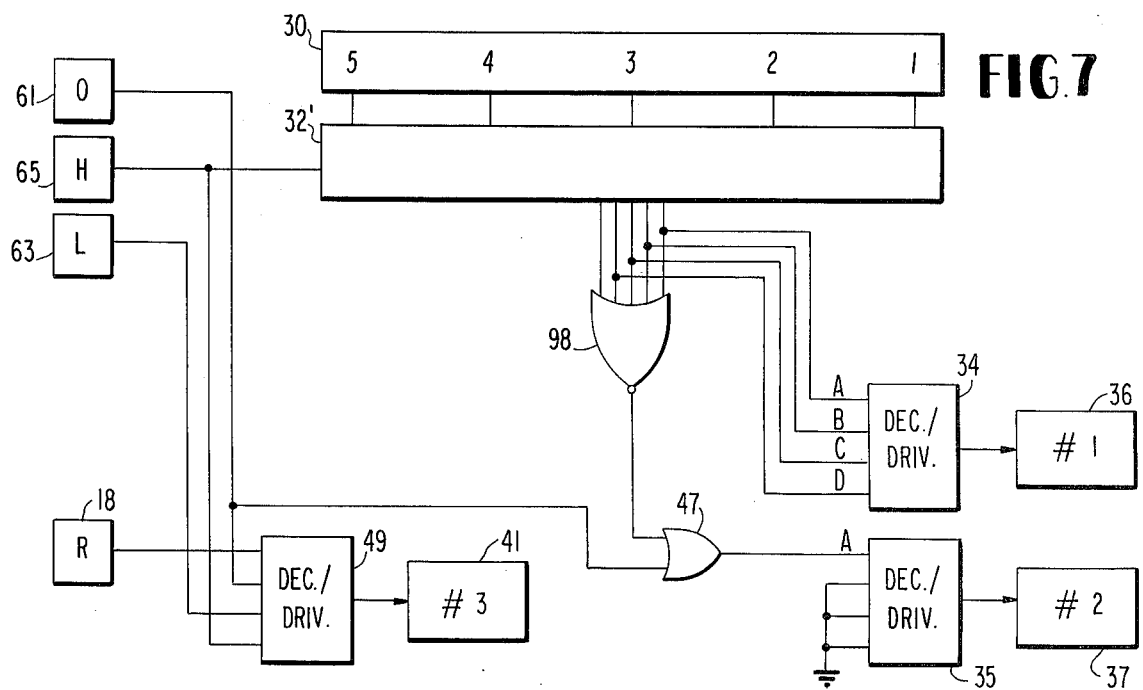
FIG. 7 is a circuit diagram of a further embodiment for use with a fifteen-speed transmission.

FIG. 7 is a modification of the circuit shown in FIG. 6 for use in a fifteen speed transmission. In FIGS. 6 and 7, corresponding elements are denoted by the same reference numerals.

In this embodiment, three separate microswitches may be provided for the gear range selector. Switch 63 is closed when the selector is in the low range, switch 65 is closed when the selector is in the normal or direct range, and switch 61 is closed when the selector is in the overdrive range. The A input of decoder/driver 35 is connected to the output of an OR gate 47, having two inputs connected respectively to the output of NOR gate 98 and to overdrive switch 61. Display unit 37 will therefore display a digital 1 when the range selector is in the normal or direct range (gears 6-10) or in the overdrive range (gears 11-15).

Switches 65, 61 and 63 are connected to appropriate inputs of decoder/driver 49 so that display unit 41 will display an L (diodes d, e, f conducting) when the range selector is in the low gear range, a "—" (diode g conducting) or "H" (diodes b, c, f, g conducting) when the range selector is in the normal or high range, and an O (diodes a, b, c, d, e, f conducting) when the range selector is in the overdrive range.

Reverse switch 18 may, as shown in FIGS. 6 and 7, be connected to an input of decoder/driver 39 and 49 to display an "R" (diodes a, b, c, e, f conducting) on display unit 41 when the transmission is shifted into reverse.

From the above description, it will be seen that each shift position can be represented by a unique binary code which drives a numeric display to indicate the number of the gear selected. If the numeric display is located in a convenient position on the dashboard of the vehicle, the driver can tell at a glance what gear is engaged in the transmission. Further, the standard gearbox housing need only be modified to provide it with threaded openings opposite the ends of the shift bars for insertion of the appropriate microswitches.

Another advantage of the invention is that no more than two microswitches per shift bar can be used with a standard gearbox.

For a five speed transmission, as few as five switches may be used (in addition to the reverse switch); for a ten speed transmission, only six switches are needed; and for a fifteen speed transmission only seven switches are required (or eight if it is desired to have an alphabetic display of the selected gear range).

While a specific embodiment of the invention has been shown and described in detail, it will be understood that the invention may be modified without departing from the spirit of the inventive principles as set forth in the hereafter appended claims.

What is claimed is:

1. Apparatus for indicating the position of a gearshift mechanism of a transmission, comprising:
    a transmission housing;
    a plurality of shift bars contained in and movable within said housing, wherein said shift bars are movable into different positions for selecting one gear from among the plurality of gears of the transmission;
    a plurality of switch means mounted in said housing for selective engagement with said forward-speed shift bars when said shift bars are moved into position representing a selected gear;
    coding means coupled to said switch means for generating a plurality of binary-coded signals, wherein each of said binary-coded signals uniquely represents one of a plurality of possible gearshift positions detected by the engagement of at least one of said shift bars with a corresponding switch means;

decoder/driver means coupled to the output of said coding means for decoding the binary-coded signal generated by said coding means; and digital display means coupled to said decoder/driver means for displaying a digital indication of the selected gear position depending on the decoded output signal of said decoder/driver means.

2. The apparatus according to claim 1, wherein said shift bars are axially movable within said housing;

said plurality of switch means comprise at least one switch mounted in said housing adjacent each axially opposite end portion of said shift bars.

3. The apparatus according to claim 1, wherein said coding means comprises:

a plurality of NOR gates, each having at least one pair of inputs connected to respective ones of said switch means for generating a plurality of distinct binary signals, each binary signal uniquely representing one gearshift position; and a plurality of inverter means coupled to respective outputs of said NOR gates for inverting the outputs of said NOR gates.

4. The apparatus according to claim 1, wherein said digital display means comprises a seven segment light emitting diode display device mounted on a vehicle in a position for easy readability by the vehicle operator.

5. The apparatus according to claim 1, wherein said plurality of switch means comprise at least one switch mounted in said housing adjacent each axially opposite end portion of said shift bars, one of said switches being closed by an associated shift bar being moved into engagement with said one switch when said associated shift bar is moved into a gear engaging position.

6. The apparatus according to claim 1, wherein:
said transmission comprises
gear range selector means for selecting one from among a plurality of gear ranges and
gear selector means coupled to said shift bars for selecting one gear from among a plurality of gears within each of said ranges;
said apparatus further comprising further switch means coupled to said range selector means and to said coding means for controlling the display of a unique digital indication as a function of the related gear range and the selected gear within the selected gear range.

7. The apparatus according to claim 6, wherein said gear ranges comprise a low gear range and a high gear range, each said range comprising five gears; wherein, in said low gear range, said digital display displays one of digits 1, 2, 3, 4, 5 and in said high gear range, said digital display displays one of numbers 6, 7, 8, 9, 10 depending upon the gear selected by said gear selector means.

8. Apparatus according to claim 7, wherein said gear ranges further comprise an overdrive range also comprising five gears; and in said overdrive range, said digital display displays one of numbers 11, 12, 13, 14, 15, depending on the gear selected by said gear selector means.

9. Apparatus according to claim 1, each of said shift bars being movable between first and second gear engaging position, said plurality of switch means comprising first and second switches associated with each shift bar and respectively engaged when said shift bar is moved into its first and second gear engaging positions.

10. The apparatus according to claim 9, wherein:
said transmission comprises
gear range selector means for selecting one from among a plurality of gear ranges and
gear selector means coupled to said shift bars for selecting one gear from among a plurality of gears within each of said ranges;
said apparatus further comprising further switch means coupled to said range selector means and to said coding means for controlling the display of a unique digital indication as a function of the related gear range and the selected gear within the selected gear range.

* * * * *

UNITED STATES PATENT AND TRADEMARK OFFICE
CERTIFICATE OF CORRECTION

PATENT NO. : 4,037,196
DATED : July 19, 1977
INVENTOR(S) : Steven B. Atkinson and James E. Reed It is certified that error appears in the above-identified patent and that said Letters Patent are hereby corrected as shown below:

Column 2, line 37, "fourth the fifth" should read --fourth and fifth--.

Column 3, line 10, after "are", insert --connected to a binary coder 32 which produces a binary coded output--.

Column 3, line 19, after "brand", insert --[Archer is a trademark of the Tandy Corporation, Fort Worth, Texas].--

Column 5, line 53,""H when" should read --"H" when--.

Column 6, line 12, "39 and 49" should read --39 or 49--.

Signed and Sealed this

Fourth Day of October 1977

[SEAL]

Attest:

RUTH C. MASON
Attesting Officer

LUTRELLE F. PARKER
Acting Commissioner of Patents and Trademarks